(12) United States Patent
Yun et al.

(10) Patent No.: US 11,051,435 B2
(45) Date of Patent: Jun. 29, 2021

(54) ELECTRONIC DEVICE COMPRISING HEAT-DISSIPATING STRUCTURE

(71) Applicant: Samsung Electronics Co., Ltd., Suwon-si (KR)

(72) Inventors: Inkuk Yun, Suwon-si (KR); Younho Choi, Suwon-si (KR); Hongki Moon, Suwon-si (KR); Hyoseok Na, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/764,607

(22) PCT Filed: Nov. 22, 2018

(86) PCT No.: PCT/KR2018/014441
§ 371 (c)(1),
(2) Date: May 15, 2020

(87) PCT Pub. No.: WO2019/103485
PCT Pub. Date: May 31, 2019

(65) Prior Publication Data
US 2020/0396871 A1 Dec. 17, 2020

(30) Foreign Application Priority Data
Nov. 24, 2017 (KR) .................... 10-2017-0158128

(51) Int. Cl.
*H05K 7/20* (2006.01)
*G06F 1/20* (2006.01)
*H01Q 1/02* (2006.01)

(52) U.S. Cl.
CPC ......... *H05K 7/20963* (2013.01); *G06F 1/203* (2013.01); *H01Q 1/02* (2013.01); *H05K 7/20509* (2013.01)

(58) Field of Classification Search
CPC .. H05K 7/20963; H05K 7/20509; H01Q 1/02; G06F 1/203
See application file for complete search history.

(56) References Cited

U.S. PATENT DOCUMENTS 8,384,604 B2 * 2/2013 Niederkorn ............ H04B 15/02
343/702
10,477,675 B1 * 11/2019 Kim .................... H04M 1/0277
(Continued)

FOREIGN PATENT DOCUMENTS

JP 2017-162983 A 9/2017
KR 10-2014-0031358 A 3/2014
(Continued)

*Primary Examiner* — Mukundbhai G Patel
(74) *Attorney, Agent, or Firm* — Jefferson IP Law, LLP

(57) ABSTRACT

An electronic device according to various embodiments of the disclosure may include a housing including a front plate and a rear plate facing the front plate, a display exposed through at least part of the front plate, an intermediate plate interposed between the display and the rear plate, and including a first face facing the display and a second face facing the rear plate, a first printed circuit board interposed between the display and the intermediate plate, a first electronic component attached to a first portion of the second face, a second electronic component attached to a second portion, away from the first portion, of the second face, and a first heat-dissipating structure extended between the first portion and the second portion along the second face.

15 Claims, 10 Drawing Sheets

(56) References Cited

U.S. PATENT DOCUMENTS

| | | |
|---|---|---|
| 2005/0094376 A1 | 5/2005 | Montoya |
| 2014/0192480 A1 | 7/2014 | Winkler et al. |
| 2015/0241935 A1 | 8/2015 | Jang et al. |
| 2016/0248893 A1 | 8/2016 | Kim |
| 2016/0282914 A1 | 9/2016 | Saito et al. |
| 2018/0090816 A1* | 3/2018 | Mow .................... H01Q 9/0421 |

FOREIGN PATENT DOCUMENTS

| | | |
|---|---|---|
| KR | 10-2015-0060007 A | 6/2015 |
| KR | 10-2016-0044052 A | 4/2016 |

* cited by examiner

ELECTRONIC DEVICE COMPRISING HEAT-DISSIPATING STRUCTURE

TECHNICAL FIELD

Various embodiments of the disclosure relate to an electronic device including a heat-dissipating structure.

BACKGROUND ART

In order to satisfy increasing demands on wireless data traffic, a wireless communication system is under development in a direction of supporting a higher data transfer rate.

A 4th Generation (4G) wireless communication technique (4G network) has been developed up to now in a direction of improving spectral efficiency substantially to increase a data transfer rate. A broadband frequency band may be used for the increase in the data transfer rate. However, since it is difficult at present to ensure a wide frequency band in the 4G wireless communication technique which uses a frequency band (less than or equal to about 5 GHz), a 5G wireless communication technique (5G network) which uses a frequency band (greater than or equal to about 26 GHz) of an extremely high frequency referred to as a millimeter wave (mmWave) is under development.

DISCLOSURE OF INVENTION

Technical Problem

A path loss may increase with an increase in a frequency for wireless communication. Due to the path loss, a propagation range may be relatively short, which causes a decrease in service coverage. A component manufactured in a form of a module in which a Radio Frequency Integrated Circuit (RFIC) and an antenna array are integrated may be used to decrease the path loss. However, heat produced in the RFIC and the antenna may lead to a deterioration in the antenna module in which the RFIC and the antenna array are integrated. An electronic device according to various embodiments of the disclosure provides a heat-dissipating structure and method for an antenna module in a situation where an inner space of the electronic device is limited.

Solution to Problem

An electronic device according to various embodiments of the disclosure may include a housing including a front plate and a rear plate facing the front plate, a display exposed through at least part of the front plate, an intermediate plate interposed between the display and the rear plate, and including a first face facing the display and a second face facing the rear plate, a first printed circuit board interposed between the display and the intermediate plate, a first electronic component attached to a first portion of the second face, a second electronic component attached to a second portion, away from the first portion, of the second face, and a first heat-dissipating structure extended between the first portion and the second portion along the second face.

Advantageous Effect of Invention

An electronic device according to various embodiments of the disclosure may include a heat-dissipating structure capable of dissipating heat of an antenna module. The heat-dissipating structure according to an embodiment may be configured to be shared by antenna modules which can be selectively activated, and thus may be mounted in a limited inner space of the electronic device. In addition, the heat-dissipating structure according to an embodiment can reduce a discomfort of a user due to an increase in a temperature of the electronic device, and can prevent an accident such as a burn or the like.

BEST MODE FOR CARRYING OUT THE INVENTION

Figure 1:
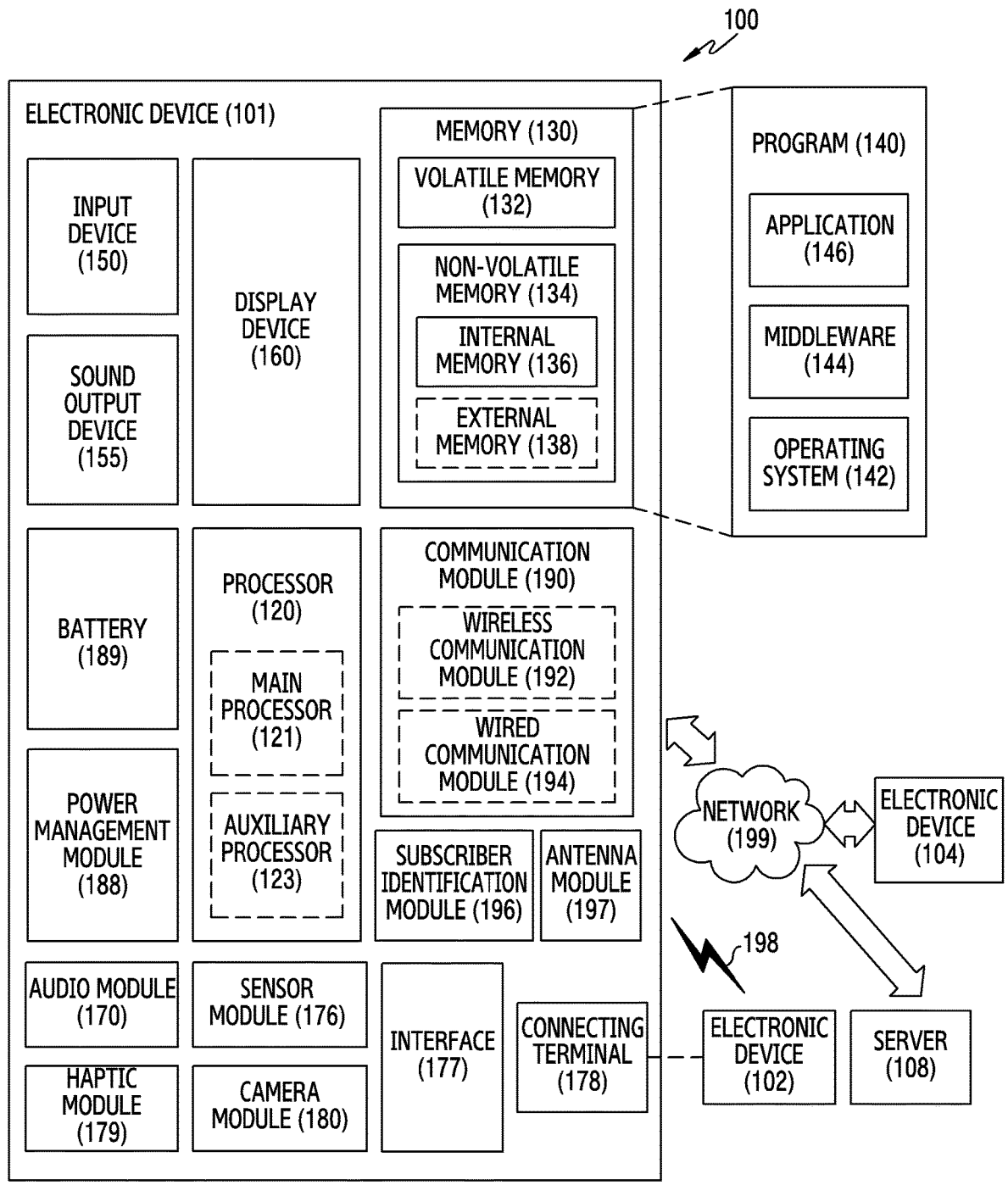
FIG. 1 is a block diagram of an electronic device in a network environment according to various embodiments.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, or a keyboard.

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector), The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other.

The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include one or more antennas, and, therefrom, at least one antenna appropriate for a communication scheme used in the communication network, such as the first network 198 or the second network 199, may be selected, for example, by the communication module 190 (e.g., the wireless communication module 192). The signal or the power may then be transmitted or received between the communication module 190 and the external electronic device via the selected at least one antenna.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
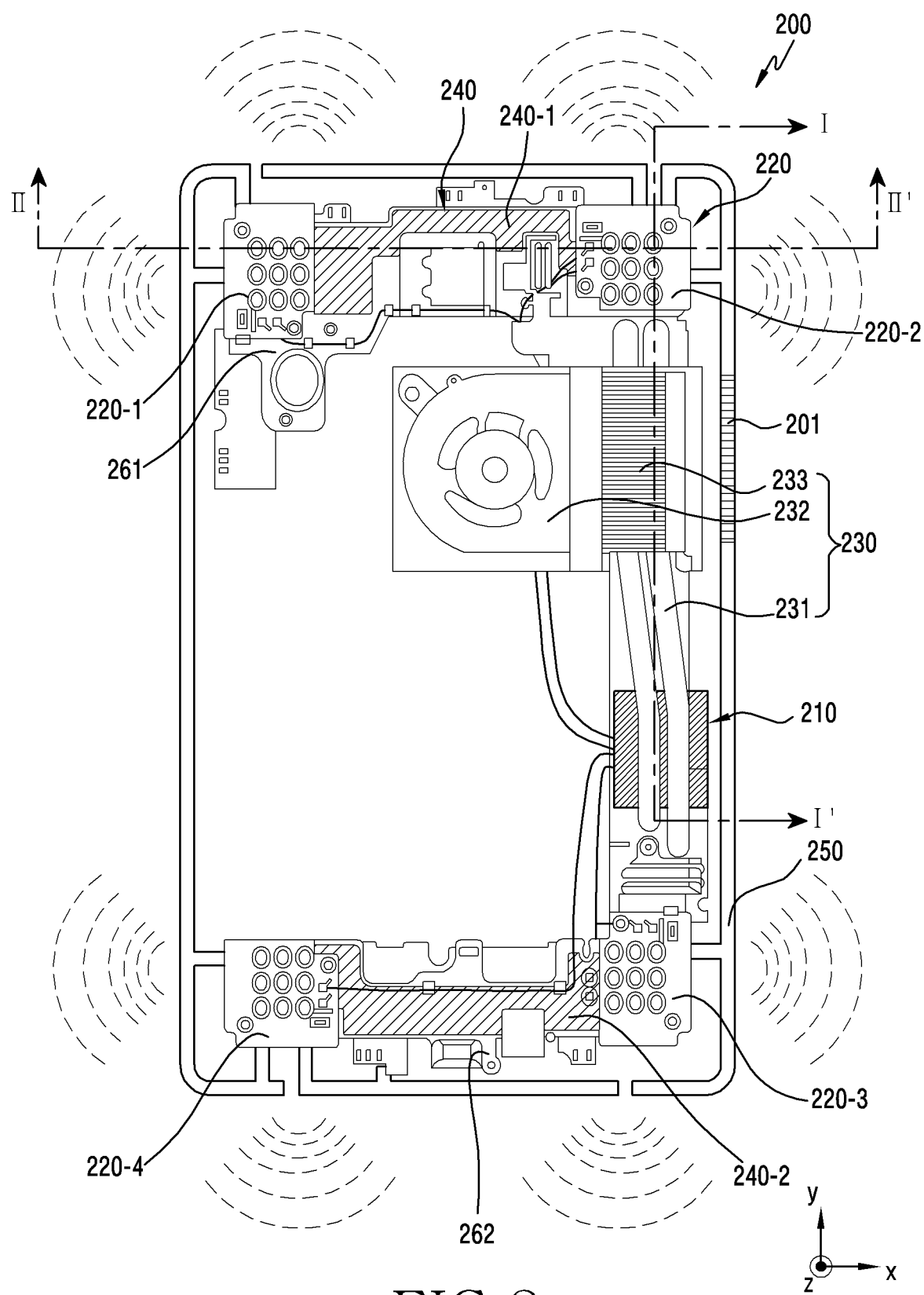
FIG. 2 is a diagram briefly illustrating an inner structure of an electronic device 200 according to various embodiments.

FIG. 2 is a diagram briefly illustrating an inner structure of an electronic device 200 according to various embodiments.

Referring to FIG. 2, the electronic device 200 according to an embodiment may include a communication processor 210 (or a Radio Frequency Integrated Circuit (RFIC)), an antenna module 220, a first heat-dissipating structure 230, and a second heat-dissipating structure 240. The communication processor 210 and the antenna module 220 may be a constitutional element of a communication module (e.g., 190 of FIG. 1). The first heat-dissipating structure 230 may imply a set of at least one constitutional element for heat dissipation of the communication processor 210. The second heat-dissipating structure 240 may imply a set of at least one constitutional element for heat dissipation of the antenna module 220. The first heat-dissipating structure 230 and the second heat-dissipating structure 240 may be thermally isolated. In other words, each of the first heat-dissipating structure 230 and the second heat-dissipating structure 240 may have a separate heat transfer path.

According to an embodiment, the first heat-dissipating structure 230 of the electronic device 200 may include a heat pipe 231, a cooling fan 232, and a heat dissipating pin 233. As a primary heat source of the electronic device 200, the communication processor 210 may produce a lot of heat while driven. The heat produced in the communication processor 210 may be transferred to the heat dissipating pin 233 via the heat pipe 231. The cooling fan 232 may produce an airflow released to an air vent 201 formed at one lateral face of the electronic device 200. The airflow produced by the cooling fan 232 may be configured to pass through the heat dissipating pin 233, so that heat produced in the communication processor 210 and transferred to the heat dissipating pin 233 via the heat pipe 231 is released to the outside of the electronic device 200. For example, the heat dissipating pin 233 may be disposed between the cooling fan 232 and the air vent 201. The heat dissipating pin 233 may have a shape through which the airflow produced by the cooling fan 232 can pass. For example, the heat dissipating pin 233 may have a shape in which a plurality of thin fins are arranged. Accordingly, cooling performance of the heat dissipating pin 233 may be improved due to an increase in an area in contact with the heat dissipating pin 233 while the airflow passes between the fins.

According to an embodiment, as a primary heat source, the electronic device 200 may further include a main processor (e.g., 120 of FIG. 1), a graphic processor, and/or an image signal processor in addition to the communication processor 210. The first heat-dissipating structure 230 may be configured to dissipate heat produced in the main processor, the graphic processor, and/or the image signal processor. In some embodiments, the electronic device 200 may further include a heat dissipating plate (not shown) for directly dissipating the heat produced in the communication processor 210.

According to an embodiment, the electronic device 200 may include the antenna module 220 as a constitutional element of the communication module. For example, the antenna module 220 may include a first antenna module 220-1, a second antenna module 220-2, a third antenna module 220-3, and a fourth antenna module 220-4.

According to an embodiment, the antenna module 220 may transmit and receive a signal of a super high frequency (greater than or equal to about 28 GHz). The higher the frequency, the greater the path loss. The antenna module 220 may further include a processor (or a processing unit) for processing a received signal, in order to decrease a path loss of a super high frequency signal received through an antenna radiator. In other words, the antenna module 220 may be provided in a form of a module configured by integrating the antenna radiator and the processor. By using a built-in processor, the antenna module 220 may convert a high frequency signal received in the antenna radiator and transmit the signal to the communication processor 210. The communication processor 210 may demodulate an intermediate frequency signal received from the antenna module 220 by using a pre-set demodulation scheme and may convert the signal into a baseband signal. In some embodiments, the antenna module 220 may further include a Front-End Module (FEM). The antenna module 220 and the communication processor 210 may be respectively referred to as RFA and RFB.

According to an embodiment, the antenna module 220 may be disposed to each corner portion of the electronic device 200, when the electronic device 200 is viewed from above (along a z-axis direction). For example, each of the first antenna module 220-1, the second antenna module 220-2, the third antenna module 220-3, and the fourth antenna module 220-4 or a combination of at least two of them may be selectively activated to prevent performance deterioration caused by physical blocking for the antenna module 220, or may be used as an antenna system supporting Multiple-Input Multiple-Output (MOMO) and/or an antenna system supporting diversity.

According to an embodiment, the electronic device 200 may further include a communication processor and antenna module based on various wireless communication schemes. For example, the electronic device 200 may further include an antenna radiator 250 for transmitting/receiving a signal of a communication scheme (or a band) different from a frequency band processed in the communication processor 210 and the antenna module 220. For example, the antenna radiator 250 may be configured to transmit and receive a signal of a frequency band less than or equal to about 5 GHz. The antenna radiator 250 may configure at least part of a boundary of the electronic device 200. In order to prevent mutual signal interference with respect to the different antenna radiator 250, the antenna module 220 may be located away from the different antenna radiator 250 by a specific interval.

According to an embodiment, the antenna module 220 configured by integrating the antenna radiator and the processor may produce a lot of heat when processing a high frequency signal. The electronic device 200 may require heat dissipation measures for the antenna module 220. The first heat-dissipating structure 230 may be configured to dissipate heat of not only the communication processor 210 but also other heat sources (e.g., a main processor, an image signal process). Heat dissipation capacity of the first heat-dissipating structure 230 may not be enough for heat dissipation of the antenna module 220. In addition, in a situation where an inner space of the electronic device 200 is limited, it may be difficult for the first heat-dissipating structure 230 to configure a heat transfer path between the antenna modules 220. Accordingly, the electronic device 200 may further include the separate second heat-dissipating structure 240 for heat dissipation of the antenna module 220.

The second heat-dissipating structure 240 may be independent of the first heat-dissipating structure 240. In other words, a heat transfer path of the first heat-dissipating structure 230 and a heat transfer path of the second heat-dissipating structure 240 may be separated from each other. A heat transfer path from the second heat-dissipating structure 240 to the antenna module 220 and a heat transfer path from the first heat-dissipating structure 230 to the communication processor 210 may be configured such that there is no substantial heat exchange.

According to an embodiment, the second heat-dissipating structure 240 may include a first heat-dissipating structure 240-1 (or a heat dissipating plate) for the first antenna module 220-1 and second antenna module 220-2, and a second heat-dissipating structure 240-2 for the third antenna module 220-3 and fourth antenna module 220-4.

According to an embodiment, when the electronic device 200 is viewed from above, the first heat-dissipating structure 230 and the second heat-dissipating structure 240 may be disposed not to overlap. For example, the first heat-dissipating structure 230 may be disposed to one lateral end of the electronic device 200. The first heat-dissipating structure 240-1 of the second heat-dissipating structure 240 may be disposed between the first antenna module 220-1 and the second antenna module 220-2 at an upper end of the electronic device 200. The second heat-dissipating structure 240-2 of the second heat-dissipating structure 240 may be disposed between the third antenna module 220-3 and the fourth antenna module 220-4 at a lower end of the electronic device 200.

Hereinafter, a configuration in which the heat transfer path of the second heat-dissipating structure 24 and the heat transfer path of the first heat-dissipating structure 230 are separated will be discussed in detail with reference to FIG. 3 and FIG. 4. In addition, various configurations of the second heat-dissipating structure 240 in the electronic device 200 may be discussed in detail with reference to FIG. 6 to FIG. 9.

Figure 3:
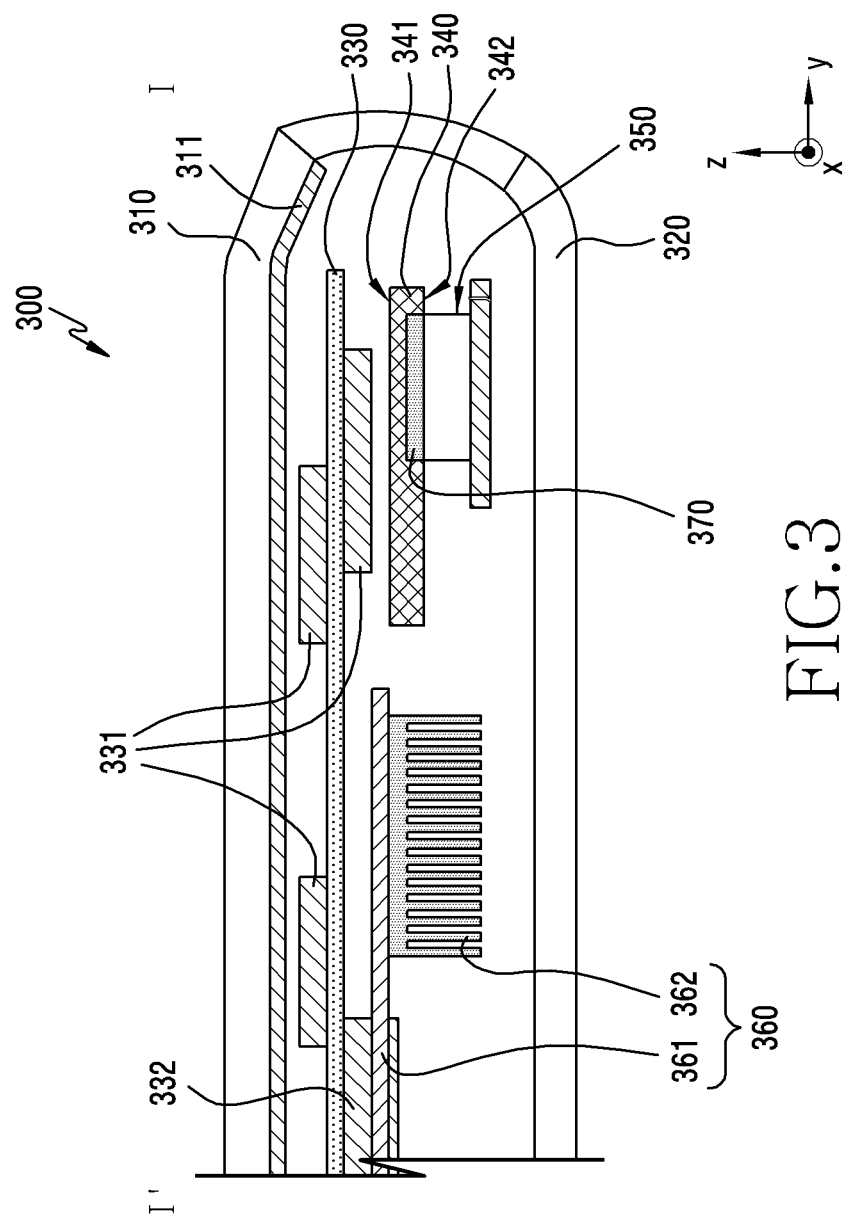
FIG. 3 is a cross-sectional view of an electronic device, cut along a length direction, according to various embodiments.

FIG. 3 is a cross-sectional view of an electronic device, cut along a length direction, according to various embodiments. An electronic device 300 of FIG. 3 may have the same or similar configuration at least in part with the electronic device 200 of FIG. 2. In other words, FIG. 3 may be a cross-sectional view of the electronic device 200 of FIG. 2, cut along a length direction (I-I').

Referring to FIG. 3, the electronic device 300 according to an embodiment may include a front plate 310, a display 311, a rear plate 320, a printed circuit board 330, and an intermediate plate 340. The rear plate 320 may face away from the front plate 310. The display 311 may be interposed between the front plate 310 and the rear plate 320. The intermediate plate 340 may be interposed between the display 311 and the rear plate 320.

According to an embodiment, the display 311 may be laminated below the front plate 310. The display 311 may be exposed through at least part of the front plate 310. For example, the front plate 310 may be transparent at least in part. Accordingly, the front plate 310 may be referred to as a transparent cover, a glass cover, or the like. According to an embodiment, the front plate 310 and the display 311 may be a laminated body including a plurality of layers. For example, a polarization-layer, a touch sensor-layer, or the like may be further interposed between the front plate 310 and the display 311. A pressure sensor-layer, a shield-layer, or the like may be further laminated below the display 311.

The printed circuit board 330 may be interposed between the front plate 310 and the rear plate 320. Various electronic components 331 for driving the electronic device 300 may be mounted on the printed circuit board 330. For example, a communication processor 332 may be mounted on the printed circuit board 330. The various electronic components 331 and the communication processor 332 may be mounted on both sides of the printed circuit board 330. The communication processor 332 may produce a lot of heat when driven. The electronic device 300 may include a first heat-dissipating structure 360 for heat dissipation of the communication processor 332. The first heat-dissipating structure 360 may include a heat pipe 361 and a heat dissipating pin 362. Heat produced in the communication processor 332 may be transferred for heat dissipation to the heat dissipating pin 362 along the heat pipe 361.

The intermediate plate 340 may include a first face 341 facing the display 311 and a second face 342 facing the rear plate 320. The antenna module 350 may be mounted on the second face 342 of the intermediate plate 340. The antenna module 350 may be preferentially disposed to be as close as possible to the rear plate 320 to improve radiation efficiency. The intermediate plate 340 may include a second heat-dissipating structure 370 (or a heat-dissipating structure) disposed on the second face 342. The intermediate plate 340 may be a support for fixing the first heat-dissipating structure 370 and the antenna module 350 into the electronic device 300. The second heat-dissipating structure 370 may be thermally connected with the antenna module 350. The second heat-dissipating structure 370 may receive conducted heat produced in the antenna module 350 and may radiate the heat to the air. The second heat-dissipating structure 370 may be formed of a material having a high thermal conductivity. For example, the second heat-dissipating structure 370 may be formed of at least one of copper, aluminum, stainless steel (SUS), and graphite, or may include a heat pipe.

As illustrate, the antenna module 350 and second heat-dissipating structure 370 according to an embodiment may be physically isolated from the first heat-dissipating structure 360 and electronic components thermally dissipated by the first heat-dissipating structure 360. For example, the antenna module 350 and the second heat-dissipating structure 370 may be disposed away from the first heat-dissipating structure 360 along a length direction (a y-axis). In addition, the antenna module 350 and the second heat-dissipating structure 370 may be disposed to overlap with the printed circuit board 330 and the various electronic components 331 when viewed in a height direction (a z-axis), and may be disposed to be spaced apart when viewed in a lateral direction (an x-axis or y-axis direction). In other words, the intermediate plate 340 as a support of the first antenna module 350 and second heat-dissipating structure 370 may be isolated from the first heat-dissipating structure 360 or constitutional elements (e.g., the printed circuit board 330, the electronic components 331, and the communication processor 332) thermally dissipated by the first heat-dissipating structure 360. The antenna module 350 and the intermediate plate 340 may be referred to as having an island structure.

According to an embodiment, the intermediate plate 340 may function as a partition for blocking heat of different components, for example, the printed circuit board 330 and the first heat dissipating structure 360. The second heat-dissipating structure 370 may be disposed to the second face 342 opposite to the first face 341 of the intermediate plate 340 facing constitutional elements (e.g., the printed circuit board 330, the electronic components 331, and the communication processor 332) thermally dissipated by the first heat dissipating structure 360. The intermediate plate 340 may be formed of a material having a thermal conductivity relatively lower than that of the second heat-dissipating structure 370.

The electronic device 300 has a structure in which the antenna module 350 and the second heat-dissipating structure 370 are physically isolated from electronic components which perform heat dissipation, thereby dissipating heat of the antenna module 350.

Figure 4:
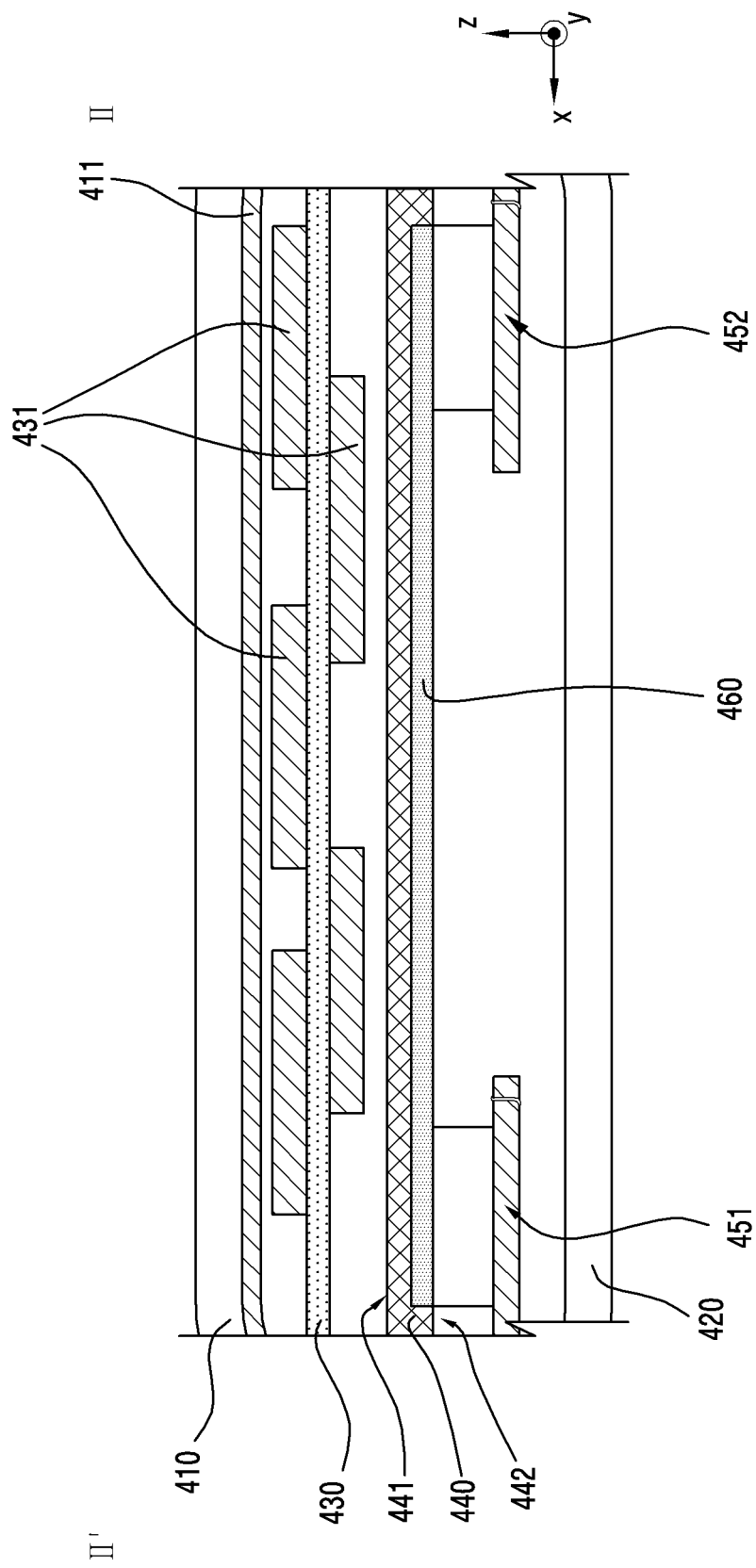
FIG. 4 is a cross-sectional view of an electronic device, cut along a width direction, according to various embodiments.

FIG. 4 is a cross-sectional view of an electronic device, cut along a width direction, according to various embodiments. An electronic device 400 of FIG. 4 may have the same or similar configuration at least in part with the electronic device 200 of FIG. 2. In other words, FIG. 4 may be a cross-sectional view of the electronic device 200 of FIG. 2, cut along a width direction (II-II').

Referring to FIG. 4, the electronic device 400 according to an embodiment may include a front plate 410, a display 411, a rear plate 420, a printed circuit board 430, and an intermediate plate 440. The rear plate 420 may face away from the front plate 410. The display 411 may be interposed between the front plate 410 and the rear plate 420. The intermediate plate 440 may be interposed between the display 411 and the rear plate 420.

According to an embodiment, the intermediate plate 440 may include a first face 441 facing the display 311 and a second face 442 facing the rear plate 420. A plurality of antenna modules may be mounted on the second face 442 of the intermediate plate 440. The intermediate plate 440 may include a second heat-dissipating structure 460 disposed on the second face 442. The second heat-dissipating structure 460 may be thermally connected with a first antenna module 451 and a second antenna module 452. The second heat-dissipating structure 460 may be exposed at least in part toward the rear plate 420 from the second face 442 opposite to the first face 441 facing different constitutional elements (e.g., the printed circuit board 430 and the electronic components 431). The second heat-dissipating structure 460 may receive conducted heat produced in the first antenna module 451 and/or the second antenna module 452, and may dissipate the heat to the air in a space between the intermediate plate 440 and the rear plate 420. In this case, the intermediate plate 440 may function as a partition for blocking heat exchange of the second heat-dissipating structure 460 and different constitutional elements. The second heat-dissipating structure 460 may be formed of a material having a high thermal conductivity. For example, the second heat-dissipating structure 460 may be formed of at least one of copper, aluminum, stainless steel (SUS), and graphite, or may include a heat pipe.

According to an embodiment, the first antenna module 451 and the second antenna module 452 may have a structure which shares the second heat-dissipating structure 460. For example, the first antenna module 451 and the second antenna module 452 may be mounted at both ends of the intermediate plate 440. The second heat-dissipating structure 460 may be extended between a portion to which the first antenna module 451 is attached and a portion to which the second antenna module 452 is attached, along the second face 442 of the intermediate plate 440. According to a wireless communication scheme, the antenna modules 451 and 452 may be selectively activated. When the first antenna module 451 is activated and the second antenna module 452 is deactivated, the second heat-dissipating structure 460 may dissipate heat produced in the first antenna module 451. When the second antenna module 452 is activated and the first antenna module 451 is deactivated, the second heat-dissipating structure 460 may dissipate heat produced in the second antenna module 452. Without being limited to the embodiment in which the first antenna module 451 and the second antenna module 452 are selectively activated, the first antenna module 451 and the second antenna module 452 may be simultaneously activated.

That is, in a situation where an inner space of the electronic device 400 is limited, the second heat-dissipating structure 460 may be configured to occupy a space between the first antenna module 451 and the second antenna module 452. The larger the volume and the wider the area exposed to the outside, the higher the heat dissipating performance of the second heat-dissipating structure 460. The antenna modules 451 and 452 which can be selectively activated may have a structure of sharing the second heat-dissipating structure 460, thereby improving a heat dissipating effect.

Returning to FIG. 2, the electronic device 200 according to an embodiment may include the first heat-dissipating structure 240-1 shared by the first antenna module 220-1 and the second antenna module 220-2, and the second heat-dissipating structure 240-2 shared by the third antenna module 220-3 and the fourth antenna module 220-4. The first antenna module 220-1 and the second antenna module 220-2 may be disposed at both corners of an upper end of the electronic device 200. The first heat-dissipating structure 240-1 may be disposed on an intermediate plate 261 by being extended between the first antenna module 220-1 and the second antenna module 220-2. The third antenna module 220-3 and the fourth antenna module 220-4 may be disposed at both corners of a lower end of the electronic device 200. The second heat-dissipating structure 240-2 may be disposed on a second intermediate plate 262 by being extended between the third antenna module 220-3 and the fourth antenna module 220-4.

Figure 5A:
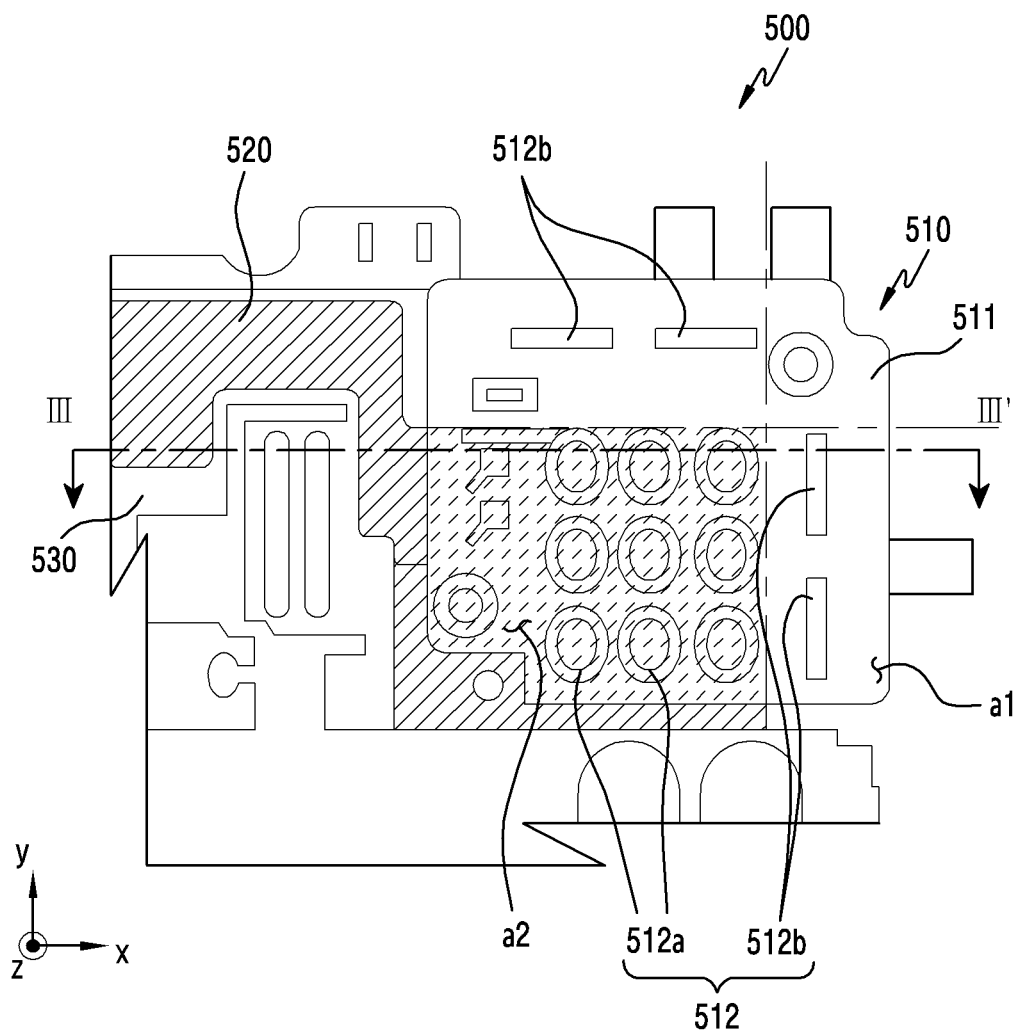
FIG. 5A is a plan view of part of a region to which an antenna module is mounted in an electronic device, viewed from above, according to various embodiments.
Figure 5B:
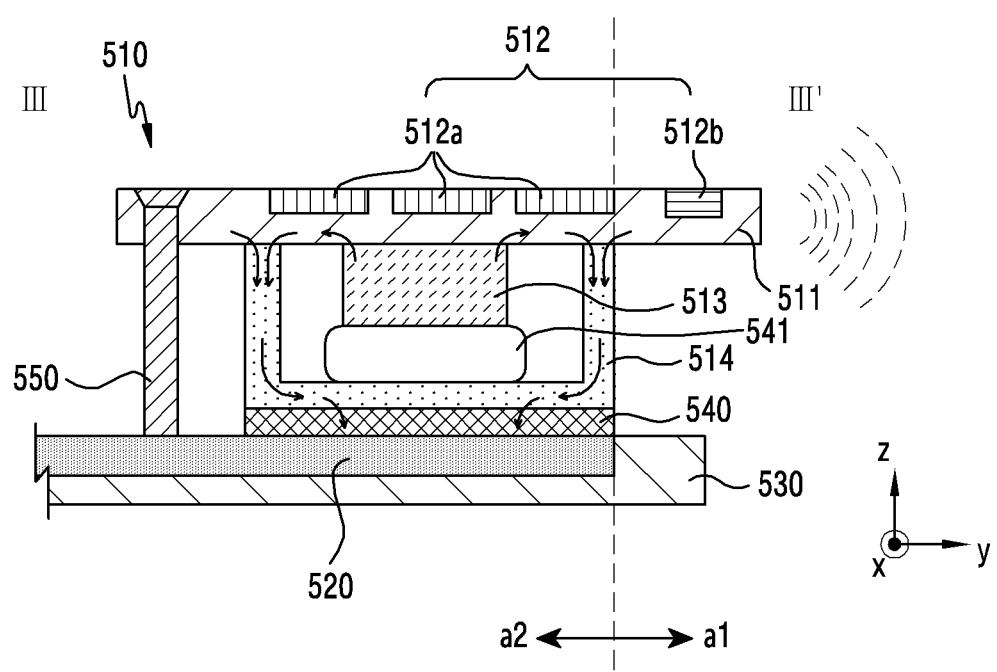
FIG. 5B is a cross-sectional view of an electronic device 500 of FIG. 5A, cut along a width direction (III-III')

FIG. 5A is a plan view of part of a region to which an antenna module is mounted in an electronic device, viewed from above, according to various embodiments. The electronic device of FIG. 5A may have the same or similar configuration at least in part with the electronic device 200 of FIG. 2. FIG. 5B is a cross-sectional view of an electronic device 500 of FIG. 5A, cut along a width direction (III-III').

Referring to FIG. 5A and FIG. 5B, an antenna module 510 according to various embodiments may include a printed circuit board 511, an array antenna 512, a radio frequency processor 513 (or a radio frequency circuit), or a shield can 514. The printed circuit board 511 may include a double (both)-side printed circuit board. The antenna array 512 may be mounted on one side of the printed circuit board 511, and the radio frequency processor 513 may be mounted on the other side. The array antenna 512 may be a separate element, and may include a patch antenna (or a micro-strip antenna), a monopole antenna, a dipole antenna, an Inverted F Antenna (IFA), a Planar Inverted F Antenna (PIFA), or a slot antenna. The array antenna 512 may include each of the aforementioned various antennas or a combination of at least two antennas, thereby diversifying a radiation pattern and feature. The radio frequency processor 513 may be configured to process an ultra-high frequency signal to be received in the array antenna 512. The shield can 514 may be configured to enclose the electronic wireless frequency processor 513 to improve Electro-Magnetic Compatibility (EMC). The shield can 514 may be formed of a conductive material. For example, the shield can 514 may be formed of a metal material such as stainless steel, nickel silver, or the like.

The antenna module 510 may be attached to a portion of the intermediate plate 530 so as to be thermally connected with a heat-dissipating structure 520. For example, the heat-dissipating structure 520 may be disposed on one side of the intermediate plate 530. The antenna module 510 may be attached to the heat-dissipating structure 520. In the antenna module 510, the shield can 514 may be partially in contact with the heat-dissipating structure 520. Heat produced in the array antenna 512 and radio frequency processor 513 may be transferred to the heat-dissipating structure 520 along the printed circuit board 511 and the shield can 514.

According to an embodiment, a Thermal Interface Material (TIM) 540 (hereinafter, referred to as TIM) may be interposed between the shield can 514 and the heat-dissipating structure 520. Although it looks like that the shield can 514 and the heat-dissipating structure 520 are mated along flat surfaces, microscopic irregularity of the surface may interrupt effective heat transfer. The TIM 540 may be used to fill the microscopic irregularity between the shield can 514 and the heat-dissipating structure 520 so that bonding is achieved without bubbles and the heat is effectively transferred. The TIM 540 may be used in a form of a thermal adhesive, grease, gel, paste, liquid, or pad. The antenna module 510 may be attached to the heat-dissipating structure 520 and the intermediate plate 520 by means of the TIM 542. The antenna module 510 may be fixed to the heat-dissipating structure 520 and the intermediate plate 530 by means of a separate structure, for example, a fixing screw 550. According to an embodiment, a second TIM 541 may be disposed between the wireless frequency circuit 513 and the shield can 514. The second TIM 541 may transfer heat of the wireless frequency circuit 513 directly to the shield can 514. In some embodiments, only the second TIM 541 may be interposed between the wireless frequency circuit 513 and the heat-dissipating structure 520. The radio frequency circuit 513 may transfer heat directly to the heat-dissipating structure 520 via the second TIM 541. In this case, the shield can 514 may have a pipe shape and may be disposed to enclose the radio frequency circuit 513 and the second TIM 541 in lateral faces.

According to an embodiment, the array antenna 512 may include a directional first antenna 512a and a non-directional second antenna 512b. For example, the first antenna 512a may include a patch antenna having a radiation pattern (or a beam pattern) facing an open upper side (a z-axis direction) of the printed circuit board 511. The second antenna 512b may include a dipole antenna having an omni-directional radiation pattern. The radiation pattern may be distorted due to interference of a conductive material in the vicinity, which may lead to a deterioration in performance of the second antenna 512b. The shield can 514 and/or heat-dissipating structure 520 formed of a conductive material may be located such that normal driving of the second antenna 512b is not interrupted in the printed circuit board 511. According to an embodiment, the shield can 514 and/or the heat-dissipating structure 520 may be disposed not to overlap with a region a1 to which the second antenna 512b is disposed, when the antenna module 510 is viewed from above (along a z-axis direction). The shield can 514 and/or the heat-dissipating structure 520 may be disposed not to overlap with a region a2 to which the first antenna 512a less influenced by a conductive material is disposed, when the antenna module 510 is viewed from above.

According to an embodiment, in order to improve heat-dissipating efficiency, the heat-dissipating structure 520 may be designed to conform to an edge shape of the shield can 514 which is in contact with the region a2 to which the second antenna 512b is disposed. The heat-dissipating structure 520 may be disposed not to overlap with the region a2 to which the second antenna 512b is disposed, when the antenna module 510 is viewed from above. However, the embodiment is not limited thereto, and thus a shape and size of the heat-dissipating structure 520 may be designated irrespective of an arrangement relation of the array antenna 512 and the shield can 514, when heat dissipation of the antenna module 510 is preferred or a radiation pattern of an antenna is not distorted.

Figure 6:
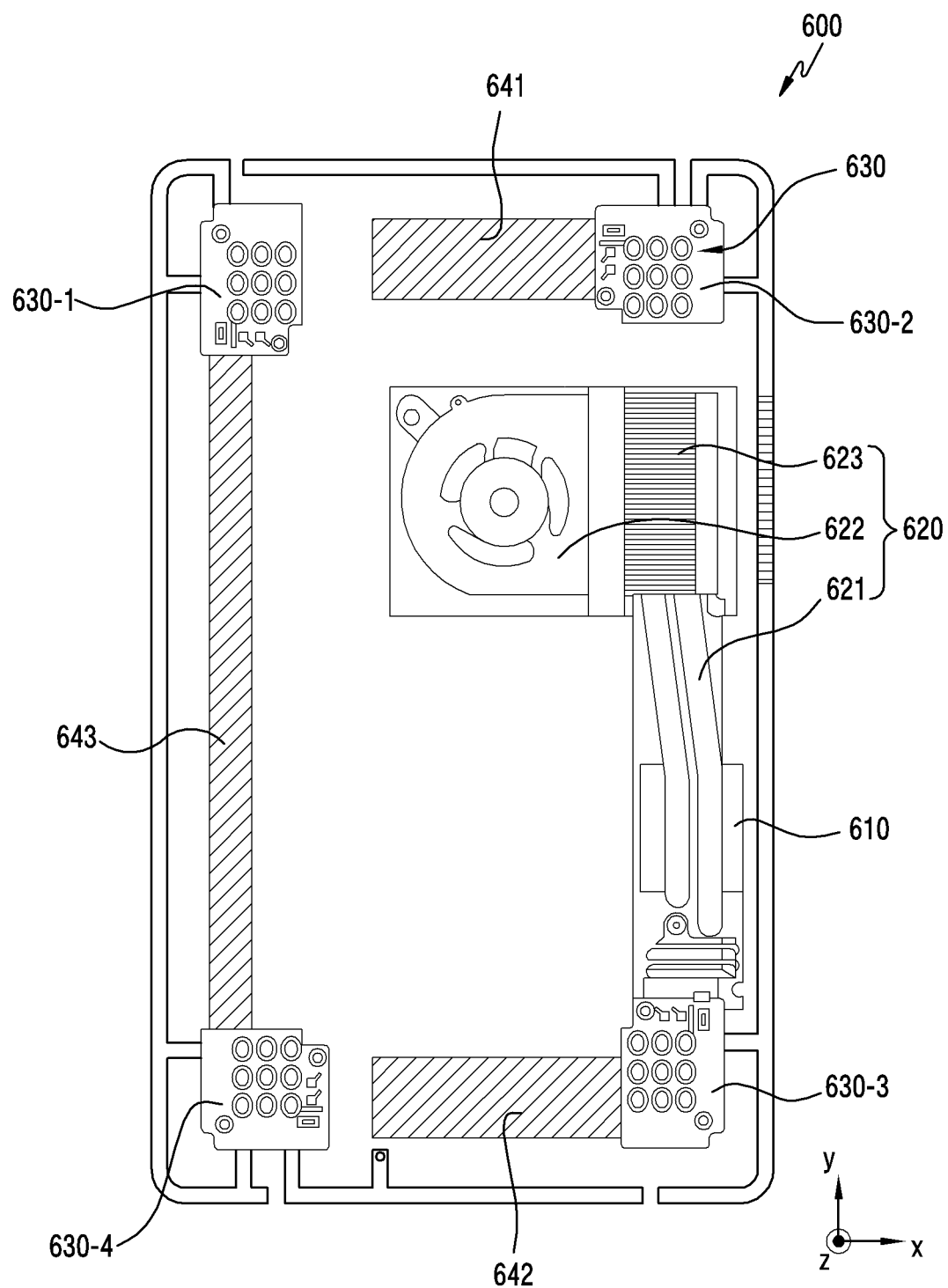
FIG. 6 to FIG. 9 are plan views of an electronic device including a heat-dissipating structure according to various embodiments for an antenna module, respectively.

FIG. 6 is a plan view of an electronic device including a heat-dissipating structure according to various embodiments for an antenna module. An electronic device 600 of FIG. 6 may have the same or similar configuration at least in part with the electronic devices 200, 300, 400, and 500 of FIG. 2 to FIG. 5A. Redundant descriptions on the same configuration will be omitted.

Referring to FIG. 6, the electronic device 600 according to various embodiments may include a communication processor 610, a first heat-dissipating structure 620, and an antenna module 630. The first heat-dissipating structure 620 may dissipate heat produced in the communication processor 610 and/or an electronic component mounted on a main printed circuit board. The first heat-dissipating structure 620 may include a heat pipe 621, a cooling pan 622, or a heat-dissipating pin 623. The heat produced in the communication processor 610 may be transferred to the heat-dissipating pin 623 through the heat pipe 621, and may be efficiently thermally dissipated to the air by an airflow produced by the cooling pan 622. The antenna module 630 may include a first antenna module 630-1, a second antenna module 630-2, a third antenna module 630-3, and a fourth antenna module 630-4. The antenna modules 630-1, 630-2, 630-3, and 630-4 may be respectively disposed at any suitable locations of the electronic device 600 to establish communication via a MIMO and/or diversity system. For example, the first antenna module 630-1 may be disposed to a corner portion of an upper left end of the electronic device 600. The second antenna module 630-2 may be disposed to a corner portion of an upper right end of the electronic device 600. The third antenna module 630-3 may be disposed to a corner portion of a lower right end of the electronic device. The fourth antenna module 630-4 may be disposed to a corner portion of a lower left end of the electronic device 600. The antenna modules 630 may require a heat-dissipating structure independent of the first heat-dissipating structure 620.

According to an embodiment, the electronic device 600 may include a second heat-dissipating structure 641 for the second antenna module 630-2 and a third heat-dissipating structure 642 for the third antenna module 630-3. The electronic device 600 may further include a fourth heat-dissipating structure 643 for the first antenna module 630-1 and fourth antenna module 630-4. The second heat-dissipating structure 641 and the third heat-dissipating structure 642 may be thermally connected respectively to the second antenna module 630-2 and the third antenna module 630-3. The second heat-dissipating structure 641 may be extended from the upper right end to the upper left end of the electronic device 600 to which the second antenna module 630-2 is disposed. The third heat-dissipating structure 642 may be extended from the lower right end to the lower left end of the electronic device 600 to which the third antenna module 630-3 is disposed. However, the second heat-dissipating structure 641 and the third heat-dissipating structure 642 may be thermally isolated from the first antenna module 630-1 and the fourth antenna module 630-4. The first antenna module 630-1 and the fourth antenna module 630-4 may be configured to share the fourth heat-dissipating structure 643. The fourth heat-dissipating structure 643 may be extended between the first antenna module 630-1 and the fourth antenna module 630-4 along a length direction (a y-axis direction) of the electronic device 600. Compared to the second heat-dissipating structure 641 and the third heat-dissipating structure 642, the fourth heat-dissipating structure 653 may have a long length in a length direction (a y-axis direction) even if a width thereof (an x-axis direction) is narrow, thereby ensuring sufficient heat-dissipation performance. Accordingly, the antenna modules 630 may ensure improved heat-dissipation performance in a situation where an inner space of the electronic device 600 is limited.

Figure 7:
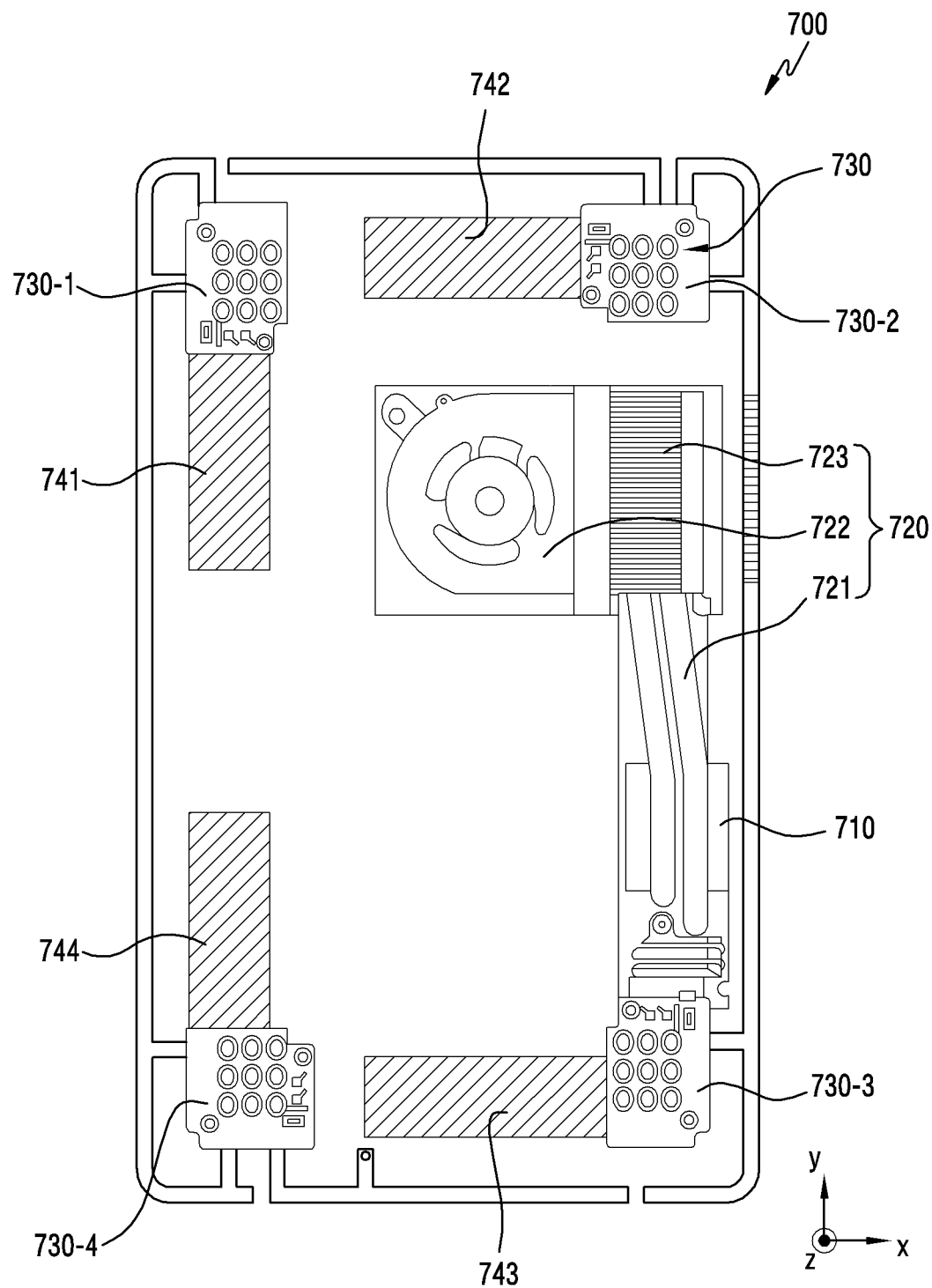

FIG. 7 is a plan view of an electronic device including a heat-dissipating structure according to various embodiments for an antenna module. An electronic device 700 of FIG. 7 may have the same or similar configuration at least in part with the electronic devices 200, 300, 400, and 500 of FIG. 2 to FIG. 5A. Redundant descriptions on the same configuration will be omitted.

Referring to FIG. 7, the electronic device 700 according to various embodiments may include a communication processor 710, a first heat-dissipating structure 720, and an antenna module 730. The first heat-dissipating structure 720 may dissipate heat produced in the communication processor 710 and/or an electronic component mounted on a main printed circuit board. The first heat-dissipating structure 720 may include a heat pipe 721, a cooling pan 722, or a heat-dissipating pin 723. The heat produced in the communication processor 710 may be transferred to the heat-dissipating pin 723 through the heat pipe 721, and may be efficiently thermally dissipated to the air by an airflow produced by the cooling pan 722. The antenna module 730 may include a first antenna module 730-1, a second antenna module 730-2, a third antenna module 730-3, and a fourth antenna module 730-4. The antenna modules 730-1, 730-2, 730-3, and 730-4 may be respectively disposed at any suitable locations of the electronic device 700 to establish communication via a MIMO and/or diversity system. For example, the first antenna module 730-1 may be disposed to a corner portion of an upper left end of the electronic device 700. The second antenna module 730-2 may be disposed to a corner portion of an upper right end of the electronic device 700. The third antenna module 730-3 may be disposed to a corner portion of a lower right end of the electronic device. The fourth antenna module 730-4 may be disposed to a corner portion of a lower left end of the electronic device 700. The antenna modules 730 may require a heat-dissipating structure independent of the first heat-dissipating structure 720.

According to an embodiment, the electronic device 700 may have a separate heat-dissipating structure of each of the antenna modules 730. For example, the electronic device 700 may include a second heat-dissipating structure 741 for the first antenna module 730-1, a third heat-dissipating structure 742 for the second antenna module 730-2, and a fourth heat-dissipating structure 743 for the third antenna module 730-3, and a fifth heat-dissipating structure 744 for the fourth antenna module 730-4. Each of the heat-dissipating structures 741 to 744 may have any shape to have a heat dissipation function according to a limitation of an inner space of the electronic device 700. Since each of the antenna modules 730 has a separate heat-dissipating structure, a deterioration in antenna performance can be prevented even if the antenna modules 730 are simultaneously activated.

Figure 8:
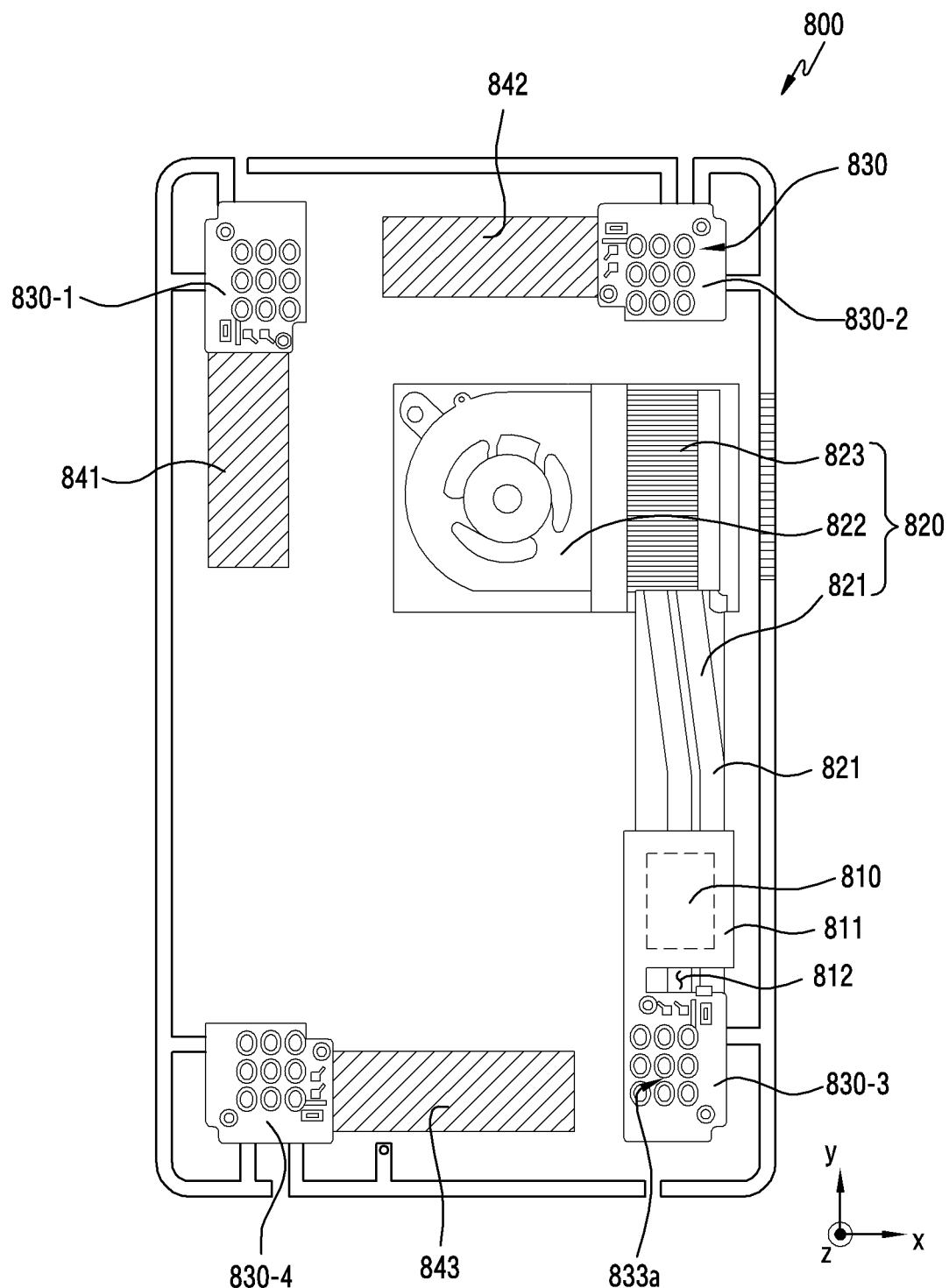

FIG. 8 is a plan view of an electronic device including a heat-dissipating structure according to various embodiments for an antenna module. An electronic device 800 of FIG. 8 may have the same or similar configuration at least in part with the electronic devices 200, 300, 400, and 500 of FIG. 2 to FIG. 5A. Redundant descriptions on the same configuration will be omitted.

Referring to FIG. 8, the electronic device 800 according to various embodiments may include a communication processor 810, a first heat-dissipating structure 820, and an antenna module 830. The first heat-dissipating structure 820 may dissipate heat produced in the communication processor 810 and/or an electronic component mounted on a main printed circuit board. The first heat-dissipating structure 820 may include a heat pipe 821, a cooling pan 822, or a heat-dissipating pin 823. The heat produced in the communication processor 810 may be transferred to the heat-dissipating pin 823 through the heat pipe 821, and may be efficiently thermally dissipated to the air by an airflow produced by the cooling pan 822. The antenna module 830 may include a first antenna module 830-1, a second antenna module 830-2, a third antenna module 830-3, and a fourth antenna module 830-4. The antenna modules 830-1, 830-2, 830-3, and 830-4 may be respectively disposed at any suitable locations of the electronic device 800 to establish communication via a MIMO and/or diversity system. For example, the electronic device 800 may include the four antenna modules 830. The first antenna module 830-1 may be disposed to a corner portion of an upper left end of the electronic device 800. The second antenna module 830-2 may be disposed to a corner portion of an upper right end of the electronic device 800. The third antenna module 830-3 may be disposed to a corner portion of a lower right end of the electronic device. The fourth antenna module 830-4 may be disposed to a corner portion of a lower left end of the electronic device 800.

According to an embodiment, the antenna modules 830 may require a heat-dissipating structure independent of the first heat-dissipating structure 820. Alternatively, at least any one of the antenna modules 830 may be thermally dissipated by the first heat-dissipating structure 820. For example, the electronic device 800 may include a second heat-dissipating structure 841 for the first antenna module 830-1, a third heat-dissipating structure 842 for the second antenna module 830-2, and a fourth heat-dissipating structure 843 for the fourth antenna module 830-3. The third antenna module 830-3 may be thermally dissipated by the first heat-dissipating structure 820. The third antenna module 830-3 may be thermally connected with the heat pope 821. According to an embodiment, the third antenna module 830-3 may be disposed adjacent to the communication processor 810. For example, an array antenna 830-3*a* of the third antenna module 830-3 and the communication processor 810 may be mounted on the same printed circuit board 811. In other words, the communication processor 810 may be mounted not on a main printed circuit board (e.g., 330 of FIG. 3) on which a main processor and/or an image signal processor are mounted but on the printed circuit board 811 which is the same as that of the array antenna 830-3*a*. In some embodiments, the communication processor 810 and an antenna module (e.g., 830-3) may be supported by an intermediate plate (e.g., 262 of FIG. 2). According to an embodiment, the printed circuit board 811 may further include a slit 812 to suppress heat exchange through the printed circuit board 811 between the communication processor 810 and the array antenna 830-3*a*.

Figure 9:
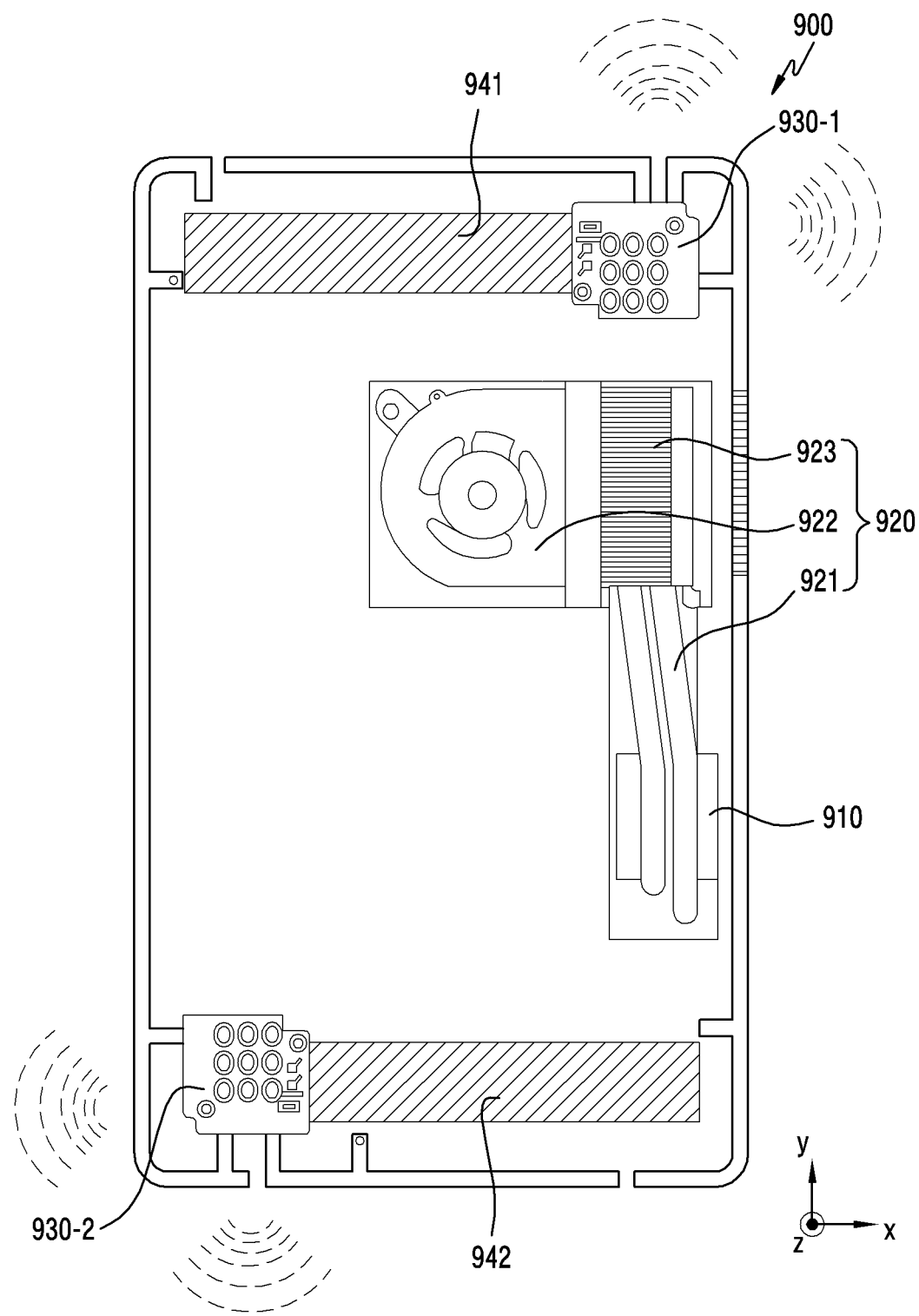

FIG. 9 is a plan view of an electronic device including a heat-dissipating structure according to various embodiments for an antenna module. An electronic device 900 of FIG. 9 may have the same or similar configuration at least in part with the electronic devices 200, 300, 400, and 500 of FIG. 2 to FIG. 5A. Redundant descriptions on the same configuration will be omitted.

Referring to FIG. 9, the electronic device 900 according to various embodiments may include a communication processor 910, a first heat-dissipating structure 920, and an antenna module 930. The first heat-dissipating structure 920 may dissipate heat produced in the communication processor 910 and/or an electronic component mounted on a main printed circuit board. The first heat-dissipating structure 920 may include a heat pipe 921, a cooling pan 922, or a heat-dissipating pin 923. The heat produced in the communication processor 910 may be transferred to the heat-dissipating pin 923 through the heat pipe 921, and may be efficiently thermally dissipated to the air by an airflow produced by the cooling pan 922. The antenna module 930 may include a first antenna module 930-1, a second antenna module 930-2, a third antenna module 930-3, and a fourth antenna module 930-4. The antenna modules 930-1, 930-2, 930-3, and 930-4 may be respectively disposed at corner portions which are diagonally paired in the electronic device 900, in order to ensure coverage for signal transmission/reception. The electronic device 900 may include the two antenna modules 930. For example, the first antenna module 930-1 may be disposed to a corner portion of an upper right end of the electronic device 900, and the second antenna module 930-2 may be disposed to a corner portion of a lower left end of the electronic device 900. For another example, the antenna modules 930 may be disposed respectively to an upper left corner and lower right corner of the electronic device 900.

According to an embodiment, the antenna modules 930 may require a heat-dissipating structure independent of the first heat-dissipating structure 920. The electronic device 900 may include a second heat-dissipating structure 941 for the first antenna module 930-1 and a third heat-dissipating structure 942 for the second antenna module 930-2. The second heat-dissipating structure 941 and the third heat-dissipating structure 942 may have any shape to have a heat dissipation function according to a limitation of an inner space of the electronic device 900. For example, the second heat-dissipating structure 941 may be extended from the thermally connected first antenna module 930-1 to the upper left corner of the electronic device 900. The third heat-dissipating structure 942 may be extended from the thermally connected second antenna module 930-2 to the lower right corner of the electronic device 900.

An electronic device according to various embodiments of the disclosure may include: a housing including a front plate (e.g., 410 of FIG. 4) and a rear plate (e.g., 420 of FIG. 4) facing the front plate; a display (e.g., 411 of FIG. 4) exposed through at least part of the front plate; an intermediate plate (e.g., 440 of FIG. 4) interposed between the display and the rear plate, and including a first face (e.g., 441 of FIG. 4) facing the display and a second face (e.g., 440 of FIG. 4) facing the rear plate; a first printed circuit board (e.g., 330 of FIG. 3) interposed between the display and the intermediate plate; a first electronic component (e.g., 451 of FIG. 4) attached to a first portion of the second face; a second electronic component (e.g., 452 of FIG. 4) attached to a second portion, away from the first portion, of the second face; and a first heat-dissipating structure (e.g., 460 of FIG. 4) extended between the first portion and the second portion along the second face.

According to an embodiment, the first heat-dissipating structure may include a layer and/or heat pipe formed of at least one of copper, aluminum, stainless steel (SUS), and graphite.

According to an embodiment, the electronic device may further include a second printed circuit board and third printed circuit board fixed on the second face.

According to an embodiment, the first electronic component may be interposed between the first portion and the second printed circuit board, and the second electronic component may be interposed between the second portion and the third printed circuit board.

According to an embodiment, the electronic device may further include: a first adhesive layer between the first electronic component and the first portion; and a second adhesive layer between the second electronic component and the second portion.

According to an embodiment, the second printed circuit board may include a first array antenna electrically connected with the first electronic component, and the third printed circuit board may include a second array antenna electrically connected with the second electronic component.

According to an embodiment, the first electronic component may include a first radio frequency circuit, and the second electronic component may include a second radio frequency circuit. The electronic device may further include a third radio frequency circuit mounted on the first printed circuit board, and the third radio frequency circuit may be configured to provide an intermediate frequency signal alternately to the first radio frequency circuit and the second radio frequency circuit.

According to an embodiment, the first radio frequency circuit and the second radio frequency circuit may be configured to generate a signal having a frequency in the range of 20 GHz to 60 GHz.

According to an embodiment, the first electronic component, the second electronic component, and the first heat-dissipating structure may be disposed along one lateral face of the housing.

According to an embodiment, the electronic device may further include a second heat-dissipating structure thermally connected with the third radio frequency circuit. The second heat-dissipating structure may include a layer, heat pipe, and/or cooling fan formed of at least one of copper, aluminum, stainless steel (SUS), and graphite.

According to an embodiment, the first array antenna may be disposed to a face facing the rear plate in the second printed circuit board, and the first radio frequency circuit may be disposed to a face facing the second face in the second printed circuit board. The first electronic component may include a shield can enclosing the first radio frequency circuit. The shield can may be attached to the first portion, and a Thermal Interface Material (TIM) may be interposed between the shield can and the first portion.

According to an embodiment, the first array antenna may include a directional first antenna and a non-directional second antenna. The shield can may be located not to overlap with a region to which the second antenna is disposed, when the second printed circuit board is viewed from above.

According to an embodiment, the heat-dissipating structure may have a shape conforming to an edge of the shield can which is in contact with the region to which the second antenna is disposed.

According to an embodiment, the first antenna array and the second antenna array may be respectively disposed at both corner portions of one lateral face of the electronic device.

According to an embodiment, the electronic device may further include a third antenna array and fourth antenna array disposed respectively at both corner portions of the other lateral face opposite to the one lateral face, and a third heat-dissipating structure extended between the third array antenna and the fourth antenna array.

According to an embodiment, the first heat-dissipating structure and the second heat-dissipating structure may include a layer and/or heat pipe formed of at least one of copper, aluminum, stainless steel (SUS), and graphite.

The electronic devices 200, 300, 400, 500, 600, 700, 800, and 900 according to the aforementioned various embodiments may include at least one of, for example, a smart phone, a tablet Personal Computer (PC), a mobile phone, a video phone, an e-book reader, a desktop PC, a laptop PC, a netbook computer, a workstation, a server, a Personal Digital Assistant (PDA), a Portable Multimedia Player (PMP), a MPEG-1 Audio Layer 3 (MP3) player, a mobile medical device, a camera, and a wearable device (e.g., smart glasses, a Head-Mounted Display (HMD), electronic clothes, an electronic bracelet, an electronic necklace, an electronic appcessory, an electronic tattoo, a smart mirror, or a smart watch). In addition, the antenna modules 220, 350, 451, 452, 510, 630, 730, 830, and 930 included in the electronic devices according to the aforementioned various embodiments may include different heat-producing electronic components, for example, an image signal processor and a power control circuit. That is, the disclosure relates to an optimal embodiment for location and arrangement relations of heat-dissipating structures, included in the electronic device, for heat dissipation of heat-producing components. In addition, various embodiments of the disclosure disclosed in the specification and the drawing are merely a specific example presented for clarity and are not intended to limit the scope of the disclosure. Therefore, in addition to the embodiments disclosed herein, various changes in forms and details made without departing from the technical concept of the disclosure will be construed as being included in the scope of the disclosure.

What is claimed is:

1. An electronic device comprising:
   a housing including a front plate and a rear plate facing the front plate;
   a display exposed through at least part of the front plate;
   an intermediate plate interposed between the display and the rear plate, and including a first face facing the display and a second face facing the rear plate;
   a first printed circuit board interposed between the display and the intermediate plate;
   a first electronic component attached to a first portion of the second face;
   a second electronic component attached to a second portion, away from the first portion, of the second face; and
   a first heat-dissipating structure extended between the first portion and the second portion along the second face.

2. The electronic device of claim 1, wherein the first heat-dissipating structure includes a layer and/or heat pipe formed of at least one of copper, aluminum, stainless steel (SUS), and graphite.

3. The electronic device of claim 1, further comprising a second printed circuit board and third printed circuit board fixed on the second face.

4. The electronic device of claim 3,
   wherein the first electronic component is interposed between the first portion and the second printed circuit board, and
   wherein the second electronic component is interposed between the second portion and the third printed circuit board.

5. The electronic device of claim 4, further comprising: a first adhesive layer between the first electronic component and the first portion; and a second adhesive layer between the second electronic component and the second portion.

6. The electronic device of claim 5,
   wherein the second printed circuit board includes a first array antenna electrically connected with the first electronic component, and
   wherein the third printed circuit board includes a second array antenna electrically connected with the second electronic component.

7. The electronic device of claim 6, wherein the first antenna array and the second antenna array are respectively disposed at both corner portions of one lateral face of the electronic device.

8. The electronic device of claim 7, further comprising:
   a third antenna array and fourth antenna array disposed respectively at both corner portions of the other lateral face opposite to the one lateral face; and
   a third heat-dissipating structure extended between the third array antenna and the fourth antenna array.

9. The electronic device of claim 6,
   wherein the first electronic component includes a first radio frequency circuit, and the second electronic component includes a second radio frequency circuit, and
   wherein the electronic device further comprises a third radio frequency circuit mounted on the first printed circuit board, and the third radio frequency circuit is configured to provide an intermediate frequency signal alternately to the first radio frequency circuit and the second radio frequency circuit.

10. The electronic device of claim 9, wherein the first radio frequency circuit and the second radio frequency circuit are configured to generate a signal having a frequency in the range of 20 GHz to 60 GHz.

11. The electronic device of claim 7, further comprising a second heat-dissipating structure thermally connected with the third radio frequency circuit, wherein the second heat-dissipating structure includes a layer, heat pipe, and/or cooling fan formed of at least one of copper, aluminum, stainless steel (SUS), and graphite.

12. The electronic device of claim 9,
wherein the first array antenna is disposed to a face facing the rear plate in the second printed circuit board, and the first radio frequency circuit is disposed to a face facing the second face in the second printed circuit board;
wherein the first electronic component includes a shield can enclosing the first radio frequency circuit, and
wherein the shield can is attached to the first portion, and a Thermal Interface Material (TIM) is interposed between the shield can and the first portion.

13. The electronic device of claim 12,
wherein the first array antenna includes a directional first antenna and a non-directional second antenna, and
wherein the shield can is located not to overlap with a region to which the second antenna is disposed, when the second printed circuit board is viewed from above.

14. The electronic device of claim 13, wherein the heat-dissipating structure has a shape conforming to an edge of the shield can which is in contact with the region to which the second antenna is disposed.

15. The electronic device of claim 1, wherein the first electronic component, the second electronic component, and the first heat-dissipating structure are disposed along one lateral face of the housing.

\* \* \* \* \*